United States Patent [19]

Hagenlocher et al.

[11] 4,284,915
[45] Aug. 18, 1981

[54] MOBILE ALTERNATOR-RECTIFIER COMBINATION CONSTRUCTION, PARTICULARLY FOR AUTOMOTIVE VEHICLES

[75] Inventors: Walter Hagenlocher, Stuttgart; Heinz Hesse, Gerlingen; Rüdiger Sohnle, Stuttgart; Christoph Kugel, Stuttgart; Johann Künz, Sersheim; Werner Lemke, Bietigheim-Bissingen; Karl Kleebaur, Allmersbach, all of Fed. Rep. of Germany

[73] Assignee: Robert Bosch GmbH, Stuttgart, Fed. Rep. of Germany

[21] Appl. No.: 85,113

[22] Filed: Oct. 15, 1979

[30] Foreign Application Priority Data

Nov. 2, 1978 [DE] Fed. Rep. of Germany ....... 2847502

[51] Int. Cl.³ ............................................ H02K 11/00
[52] U.S. Cl. ..................................... 310/68 D; 310/52
[58] Field of Search ................... 310/68 R, 68 D, 52; 357/81; 361/381–384, 417; 363/144, 145

[56] References Cited

U.S. PATENT DOCUMENTS

| | | | |
|---|---|---|---|
| 3,146,362 | 8/1964 | Bates et al. | 310/68 R |
| 3,250,928 | 5/1966 | Bates | 310/68 R |
| 3,271,601 | 9/1966 | Raver | 310/68 R |
| 3,320,498 | 5/1967 | Evans | 361/417 X |
| 3,527,972 | 9/1970 | Franz et al. | 310/68 D |
| 3,553,505 | 1/1971 | Sato | 310/68 D |
| 3,739,209 | 6/1973 | Drabik | 310/68 D |
| 3,739,210 | 6/1973 | Bahlinger et al. | 310/68 D |
| 3,831,062 | 8/1974 | Haug et al. | 363/145 X |
| 3,979,659 | 9/1976 | Lynch, Jr. et al. | 310/68 D |
| 4,197,473 | 4/1980 | Allport | 310/68 D |

*Primary Examiner*—Mark O. Budd
*Attorney, Agent, or Firm*—Frishauf, Holtz, Goodman & Woodward

[57] ABSTRACT

To form a compact combination structure which provides efficient cooling and ease of assembly, maintenance and repair, while reducing the number of elements necessary to be stocked for maintenance or repair purposes, the rectifier portion of the alternator-rectifier combination comprises two groups of rectifiers which are, respectively, secured to the surface of two disk-shaped support plates 15, 35, which have, each, ring-shaped portions 38 surrounding the shaft and radially projecting fins 39, 39'. One of the plates is formed with a hub to retain one of the bearings, the outer portion of the fins is apertured for attachment to the shell of the alternator, and additionally deformed to provide seating surfaces for accurate positioning, for example by externally applied punch marks, of the plate. An insulating spacer 43, 43' separates the two plates which are so positioned that the fins of one plate are opposite the gap between fins of the other, so that air drawn axially by a ventilating fan will cool both plates.

28 Claims, 7 Drawing Figures

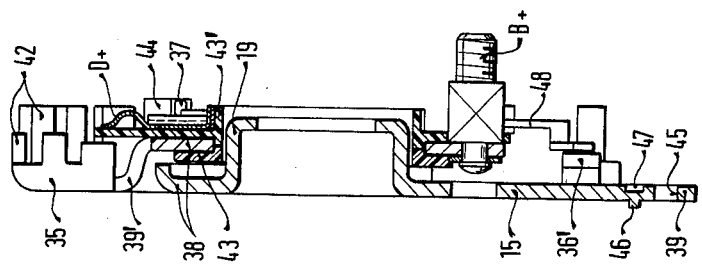
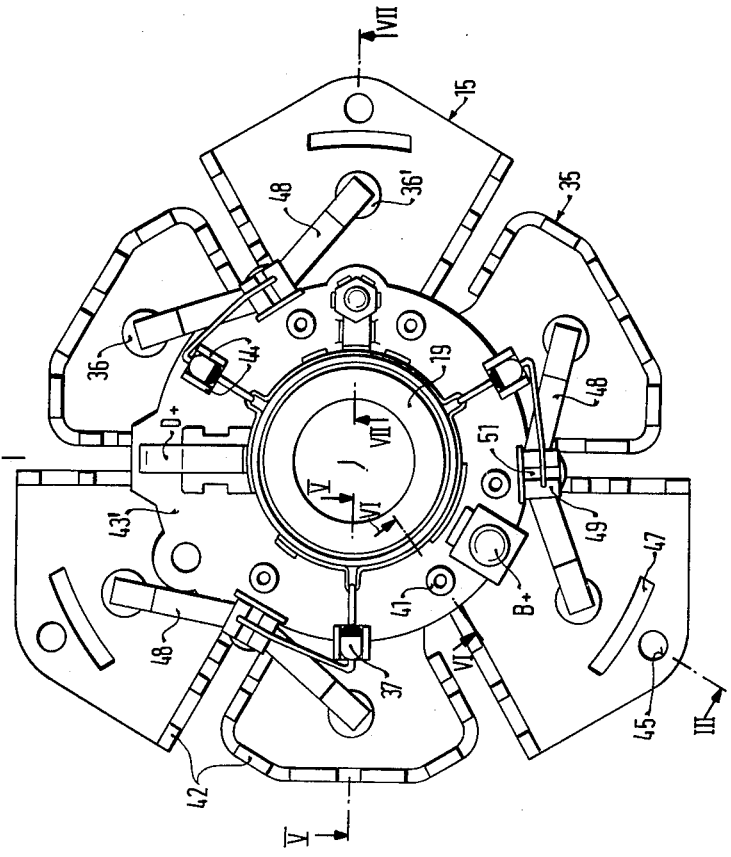

MOBILE ALTERNATOR-RECTIFIER COMBINATION CONSTRUCTION, PARTICULARLY FOR AUTOMOTIVE VEHICLES

Reference to related applications, all assigned to the assignee of the present application:

U.S. Ser. No. 085,116, filed Oct. 15, 1979, HAGENLOCHER et al; U.S. Ser. No. 085,115, filed Oct. 15, 1979, HAGENLOCHER et al; U.S. Ser. No. 085,114, filed Oct. 15, 1979, FRISTER; U.S. Ser. No. 084,111, filed Oct. 15, 1979, HAGENLOCHER et al; U.S. Ser. No. 085,112, filed Oct. 15, 1979, HAGENLOCHER et al.

The present invention relates to a mobile alternator-rectifier combination construction, and more particularly to an automotive-type three-phase alternator with a three-phase bridge rectifier secured to a portion of the alternator structure and connected to the output windings, to provide a d-c output to supply the loads of an automotive vehicle and charge the battery thereof.

BACKGROUND AND PRIOR ART

Various types of automotive alternators are known. It has been found particularly advantageous to use interdigeted pole or claw-pole type alternators with the armature windings on the stator, and a rotating field. The a-c output of the alternators is rectified, preferably in diode-type bridge rectifiers, of which one rectifier is provided to supply the load, and another rectifier assembly may be used, separately, to supply field current. Reference is made to U.S. Pat. No. 3,320,498 which shows a rectifier assembly secured to individual heat sink plates which are positioned in crossed relation to each other and spaced from each other by spacing elements. U.S. Pat. No. 3,739,210 shows a rectifier assembly for connection to generators which are shaped in partial ring form and which have conductive plates which form cooling or heat dissipating plates secured on an insulating plate.

A stacked, interlaced or sandwich-type rectifier assembly is described in German Patent DE-PS No. 22 50 557 in which the heat dissipating or heat sink plate is an essentially circular element having finger-like projections. The fingers of the respective cooling elements interdigit in such a manner that the finger of one cooling element fits in the gap between two fingers of another cooling element. U.S. Pat. No. 4,059,778-Sohnle, to which German Disclosure Document DE-OS No. 26 03 786 corresponds discloses a crossed arrangement of cooling or heat dissipating sheet metal elements which are flat and are suitable for association with or assembly with three-phase alternators. It is customary construction to insert rectifier diodes into one of the end bells or end covers of an alternator.

The various known constructions have to be built to fit specific arrangements, and they can meet only very specific requirements. If the rectifier diodes are inserted into an end bell of an alternator, the alternator can be adequately cooled and the rectifiers can be well cooled; it is difficult, however, to test the alternator, the rectifier diodes and, in case of defects, to replace the end bell and the diodes, since they have to be disconnected and new ones reconnected. Repair thus is a problem; further, the construction is specific to particular alternators and thus stocking of parts for different kinds of alternators, both for manufacture as well as for repair purposes causes problems. If the support for the rectifier diodes is a flat plate, the diodes themselves are frequently not sufficiently cooled. Forming a cooling assembly with crossed dissipating or heat sink plates and fingers requires substantial space which frequently is not available in the alternator-rectifier combination, which should be as compact as possible. Constructing the cooling plates as segmental elements, similar to a quarter-moon, has been found to provide inadequate cooling and the construction is subject to fissures and breaks. It is difficult to insulate such structures within an alternator to prevent the formation of sneak or stray currents.

Some arrangements use two cooling plates or cooling or heat dissipating elements; thus, only one group of diodes is secured to the end bell of the alternator, the other to the additional heat dissipating plate. Such additional plates have been usually assembled to the end bell as additional, separate elements which require separate assembly steps both in manufacture, and disassembly and re-assembly upon repair. Since automotive alternator structures are subject to extremes of vibration and shock, the respective elements have to be reliably secured together which requires care and hence expense in manufacture as well as upon repair or maintenance.

THE INVENTION

It is an object to improve an alternator-rectifier combination such that the structure can be easily made with minimum costs, maintained and repaired, and in which stocking of repair parts can be reduced to a minimum, due to versatility of application of the respective elements.

Briefly, two disk-shaped support plates are provided in which each has a group of rectifier diodes secured thereto; the support plates form heat sinks and heat dissipation elements for the diodes. They are positioned adjacent one axial end of the shaft of the alternator. Each support plate includes an essentially ring-shaped portion which surrounds the shaft and radially projecting fins, defining gaps therebetween. The support plates are axially staggered, that is, are superimposed upon each other and radially so positioned that the fins of one plate fit in the gaps between the fins of the other. Electrical insulating spacer means are interposed between the support plates. The diodes of groups of rectifier diodes are secured on the projecting fins. At least one of the support plates is secured to the frame of the alternator. At least one of the support plates which, preferably, is the one which is secured to the frame of the alternator, has the bearing secured to the ring-shaped portion which surronds the shaft.

The alternator-rectifier combination can be made particularly compact if, in accordance with a feature of the invention, the rectifier diodes are of the button-diode type. Additional rectifier elements, such as rectifiers for the field of the alternator, can be secured to the assembly, for example by being mounted on the insulating spacer between the plates. The plates themselves preferably have their edges bent over, for example at 90°, to form a stiffening bead, thus increasing the structural stability of the alternator-rectifier combination, while simultaneously increasing the area of the plate elements and thus increasing the area available for heat dissipation. The stability of the element carrying the bearing is important since it forms, simultaneously, an end cover of the alternator. The bent-over edges or beads can, themselves, be formed in the shape of individual fingers which further increases the cooling and heat dissipating effects. The plate elements can be made of sheet metal so that the overall manufacturing costs are substantially reduced, by using an inexpensive raw material which is shaped in an inexpensive production process. The alternator structure is particularly adapted to utilize a feature, known as such, namely the use of electrical connections in the form of contact rails which can be mechanically stressed to press the button diodes against the associated cooling and heat dissipating plate while, simultaneously, being of sufficient size to form themselves heat dissipating elements.

Drawings, illustrating a preferred example, wherein:

FIG. 3 is a cross section through the rectifier array and its associated cooling plates;

FIG. 4 is a view similar to FIG. 2, and illustrating the complete assembly; and

Figure 1:
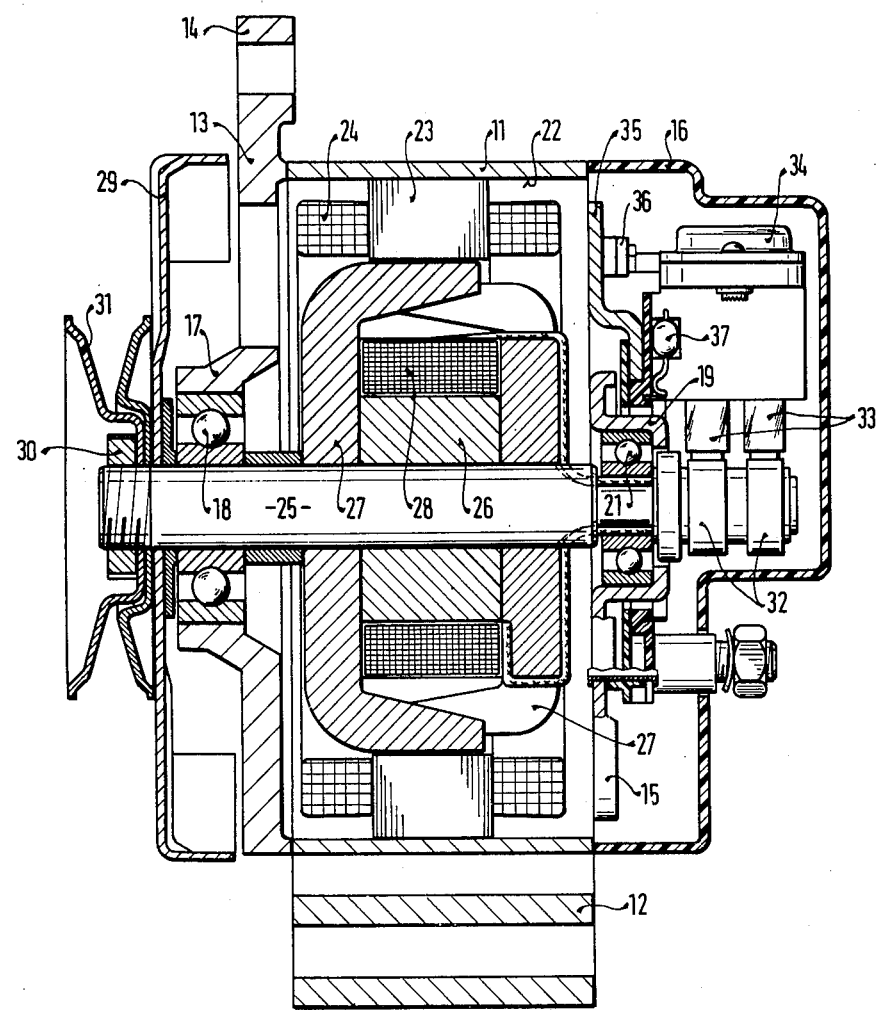
FIG. 1 is a highly schematic axial sectional view through an alternator-rectifier combination, in which all parts not necessary for an understanding of the invention have been omitted.

General construction with reference to FIG. 1:

An automotive alternator has a housing shell or frame 11, on which a holding bracket 12 is secured. At the drive side of the alternator, an end cover 13 with a holding bracket extension 14 is secured. The other axial end of the alternator is closed off by an end cover plate 15 which holds a bearing 21. A protective cover 16, for example of plastic, is attached at the axial end holding the bearing 21, and closes off the right-hand side (FIG. 1) of the alternator. The drive side of the alternator has a hub 17 attached to the end cover 13, in which a bearing 18 is seated.

The end cover 15 forms, simultaneously, a cooling plate for rectifier diode 36 and a holding element for the bearing 21, which is a fitted into a hub bushing 19. An armature core stack 23 is secured within the frame 11, the stack having armature windings 24 wound thereon. The rotor of the alternator comprises a rotor shaft 25, journalled in the bearings 18, 21, a core 26, field winding 28, and interdigited or claw-poles 27. A fan or ventilating blade 29 and a drive pulley 31 are secured to the shaft 25 at the drive end of the alternator with a nut 30. The wire ends of the field winding 28 are connected to slip rings 32, secured on the shaft 25. The slip rings 32 are in engagement with brushes retained in a brush holder 33, on which a voltage regulator 34 is mounted, and electrically connected. The rectifier which is connected to the armature winding 24 includes, besides the cover 15 and the rectifier diode 36, a further cooling plate 35. Additional rectifier diodes 37 are provided to supply rectified power to the field coil 28. The electrical connection of the voltage regulator and the field winding as well as of the alternator itself can be in accordance with any well known and standard connection.

Figure 2:
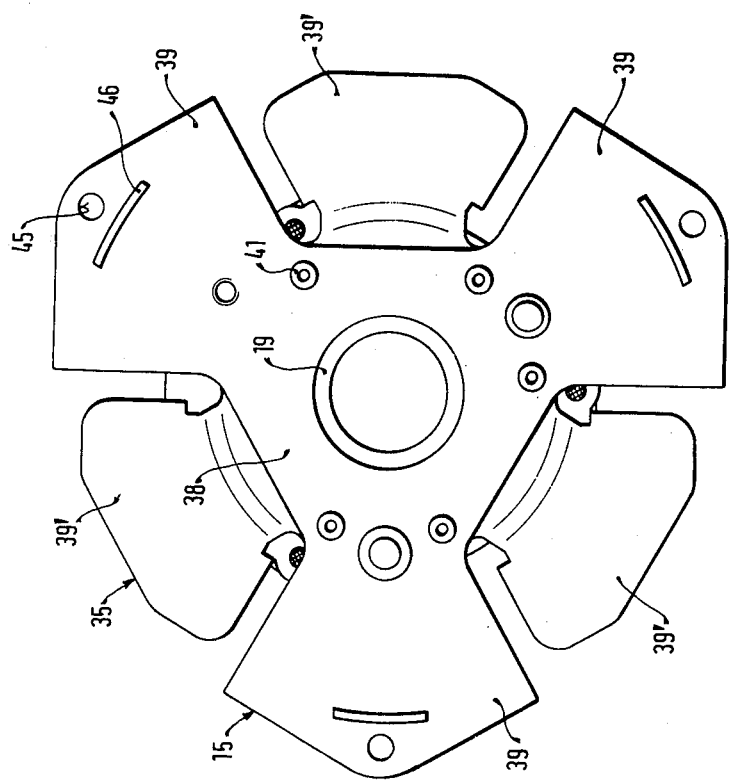
FIG. 2 is a top view of the rectifier array looked at from the side of the bearing.

The end cover 15 which, simultaneously, is a cooling element for the rectifier diodes, as well as the holder for the bearing 21, is best seen in FIG. 2. As illustrated in FIG. 2, the bearing 21 has been removed from the bearing holding bushing 19. The cooling and end plate 15 has an essentially ring-shaped portion 38 and radially externally projecting fins 39.

Figure 6:
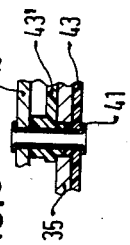

A second plate 35 has a ring-shaped portion and radially projecting fins 39'. The radially projecting fins 39, 39' are so arranged relative to each other that the fins 39 are positioned within the gaps between adjacent fins 39', and vice versa. The fins 39, 39' are slightly narrower than the dimensions resulting from a mathematically uniform division in order to provide gaps between the superposed fins, as is clearly apparent in FIG. 2, and to permit ready flow of air against as well as past the fins. The two cooling fins 15, 35 are secured together by rivets 41 (FIG. 6). The cooling plate 15 has button diodes 36' secured thereto by soldering (FIGS. 3, 4); button diodes 36 are soldered to the cooling plate 35, the diodes 36, 36' being located in the regions of the fins 39', 39.

Figure 5:
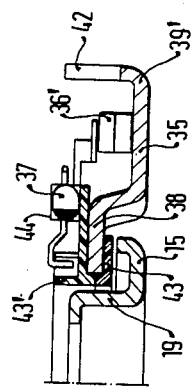
FIGS. 5, 6 and 7 are fragmentary sectional views taken along lines V—V, VI—VI and VII—VII of FIG. 4.

FIG. 3 illustrates the axial arrangement of cooling plate 15, the bearing bushing 19 and the attachment of one of the power rectifier diodes 36', as well as the relationship of the element 15 with respect to the other cooling plate 35. The edges of the projecting fins 39' of the cooling plate 35, as well as the edges of the fins 39 and the cooling plate 15 are bent over, that is, are formed with bent-over beads 42, which are slotted at the end portion to have terminal slotted fingers (FIG. 3). These bent-over edges 42 increase the effective cooling area and further contribute to the stability of the cooling plate which, preferably, is made of sheet metal. An electrically insulating spacer and carrier 43 is secured between the cooling plate 35 and the cooling plate 15, held in position by the rivets 41. The spacer 43 is extended by an extension element 43', likewise of insulating material, which is also positioned between the cooling elements 15 and 35 and engages over and around the cooling plate 35. It, also, is maintained in position by the rivets 41 (see FIG. 6). The carrier 43' has a pressure contact D+ secured thereto, which is utilized to form an electrical connection to the voltage regulator 34. The field or exciter rectifier diodes 37 are secured to the support 43' (FIGS. 3, 5). They are held in position by extensions 44 of the carrier 43.

A main power supply connecting bolt B+ is riveted to the plate 35, which forms the output terminal of the rectifier, connected to the alternator, and thus the d-c output of the alternator-rectifier combination. The negative or chassis terminal of the rectifier is formed by the plate 15 which, likewise, retains the bushing for the bearing 21 and, hence, is connected to chassis or ground through the metallic structure of the alternator. A separate B— connection can be provided, if desired.

The plate 15, which likewise secures the bearing 21, is attached to the frame or housing 11 of the alternator. To permit attachment to the alternator housing, the fins 39 are formed with openings 45 (FIG. 2). The plate 15 is centered with respect to the alternator frame or housing 11 by projecting ridges 46 which project inwardly towards the housing 11 (see FIG. 3) and which are formed by punch depressions 47 punched into the sheet metal plate 15.

FIG. 4 clearly shows the connection between the various diodes 36, 36'. Connecting rails 48 form the electrode connections to the diodes 36, 36', and additionally form cooling strips. They press the diodes 36, 36' which are formed as button diodes, see also FIG. 3, against a surface of the fins 39, 39', respectively. The connecting rails 48 are connected to the three phase terminals of the armature winding 24. In accordance with a feature of the invention, the generator is so constructed that the insulating carrier element 43' (FIG. 3) has holding clips 49 (FIG. 4) secured thereto or molded thereon, or otherwise formed thereon which simultaneously secure the electrical connecting rails 48 and are also formed to electrically and mechanically connect thereto the ends of the armature windings 24 at the connection portions 51. The connection by the ends of the armature windings 24 to the respective terminals 51 are not shown in detail, since any standard electrical terminal connection may be used.

Figure 7:
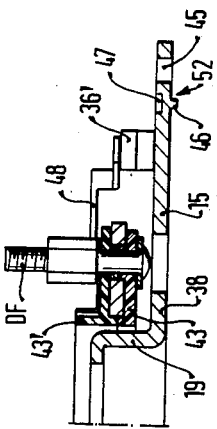

The details of the rectifier are best seen by considering FIGS. 5 to 7. FIG. 5 is a fragmentary section through one of the fins 39', to which a diode 36' is connected, showing also a portion of the bearing bushing 19 and one of the field rectifier diodes 37. FIG. 6 is a cross-section illustrating how the rivet 41 is connected, insulating the plate 35 with respect to the plate 15 by the respective insulating elements 43, 43'; FIG. 7 shows the arrangement of the connection DF, using customary notations, which is the connection between the field and the voltage regulator, and from which a wire line can be connected to a charge control indicator, such as a charge control lamp of the vehicle, in which the alternator-rectifier assembly is installed. FIG. 7 also illustrates the alignment arrangement of the plate 15 for connection with the frame or housing 11 surrounding the stator. The inwardly extending bulge, formed by an external punch mark 47, is clearly seen; the outer flank or edge 52 of the inwardly extending bulge 46 fitting against the inside surface 22 of the housing shell 11. Elongated bolts, or the like, can be passed through the openings 45 and externally of the shell 11 to the end plate 13 at the drive side, or other suitable connection arrangements to connect the end plate 15 to the alternator can be used.

The end plate-and-cooling element and heat sink 15 is preferably made of sheet metal. Such a plate is stiff in a direction transverse to a radius, that is, transverse to the longitudinal axis of the generator shaft 25. Along the shaft axis, however, and in a radial direction, such a sheet metal element acts similar to a membrane and is elastic, even if the edges of the fins 39, 39' are bent over as seen at 42 (FIGS. 3, 4, 5). This arrangement, of elasticity in the longitudinal direction of the generator shaft 25, but stiffness in a transverse direction, permits resilient acceptance of vibration, and axial movement of the generator shaft 25. Such axial movement may arise due to differences in coefficient of expansion of materials used. The housing or frame 11 of the generator is preferably made of aluminum. The generator shaft 25, however, is preferably made of steel, and hence the longitudinal or axial expansion of the housing 11 and the axial expansion of the shaft 25, under heating, may differ.

The fins 39' of the plate 35 are bent inwardly into the plane of the plate 15, as best seen in FIGS. 3 and 5. This arrangement then places all the diodes 36, 36' at equal height or level with respect to the axis of the shaft 25 of the alternator. The axial offset of one of the plates, preferably the plate 35 with the fins 39', permits reduction of the axial length of the alternator-rectifier combination, which results in a very compact overall structure.

Various changes and modifications may be made within the scope of the inventive concept.

We claim:

1. Mobile alternator-rectifier combination construction, particularly for automotive vehicles, having
   a frame structure (11);
   a stator (23, 24) secured to the frame structure and having an armature winding (24);
   a rotor (26, 27, 28) having a rotor shaft (25);
   two bearings (18, 21) journaling the rotor;
   an end cover (13) secured to one end of the frame and retaining one (18) of the two bearings, and extending transversely to the axis of rotation of the shaft;
   and two groups of rectifier diodes (36, 36') electrically connected to the armature winding,
   two membrane-like disk-shaped sheet metal support plates (15, 35) positioned adjacent the axial end of the shaft remote from said end cover (13);
   each support plate including
   an essentially ring-shaped portion (38) surrounding the shaft and radially projecting fins (39, 39') defining gaps therebetween;
   at least one (15) of the disk-shaped support plates being secured to the frame and the other (21) of said two bearings (18, 21) being secured to the ring-shaped portion (38) of said at least one (15) of the support plates (15, 35);
   one group of rectifier diodes (36, 36'), each, being secured to a respective support plate and with the diodes (36, 36') of the groups of rectifier diodes being located on the projecting fins (39, 39') of the respective disk-shaped sheet metal support plates (15, 35);
   whereby at least one support plate forms the support for the other bearing (21) and a heat sink and heat dissipation element for the diodes thereon;
   electrically insulating means (43, 43') interposed between said support plates including electrical terminal holding means (49); and
   resilient contact rails (48) forming connection means between the diodes of the groups of diodes (36, 36'), resiliently pressing against the respectively connected diodes on the associated respective fins.

2. Construction according to claim 1, wherein said rails are dimensioned and shaped with respect to the current being supplied to said rectifier diodes to form additional cooling, heat dissipating and heat sink elements for the diodes.

3. Construction according to claim 1, wherein the rectifier diodes (36, 36') are button diodes secured to a surface of the respective fins.

4. Construction according to claim 3, wherein the button diodes (36, 36') are soldered to the respective fins (39, 39').

5. Construction according to claim 1, wherein the electrical insulating means (43, 43') interposed between the support plates comprises an electrically insulating spacer element and includes a carrier portion (43');
   and a further rectifier (37) being supported on and secured to said carrier portion.

6. Construction according to claim 5, wherein said further rectifier (37) is connected to the field of the alternator secured to the rotor to supply excitation current to the alternator field.

7. Construction according to claim 1, wherein the edges (42) of said projecting fins (39, 39') are bent over from the major plane of the respective support plates to form stiffening beads.

8. Construction according to claim 7, wherein the bent-over edges have approximately the same height as the minimum projecting height of the rectifier diodes from the respective support plate.

9. Construction according to claim 7, wherein the bent-over edges have tooth or serration portions at their terminal ends to form bent-over fingers.

10. Construction according to claim 1, wherein the projecting fins of one of the support plates are axially offset with respect to the associated ring-shaped portion by a distance approximately that of the interposed electrical insulating means (43, 43') so that the respectively bent fins lie in approximately the same plane as the fins of the other plate.

11. Construction according to claim 10, wherein said electrical terminal holding means are formed to provide electrical terminal connection holders for the terminals of the armature winding (24).

12. Construction according to claim 1, wherein said one disk-shaped support plate (15) carrying said other bearing is formed with a central bearing bushing (19) at its ring-shaped portion (38) to retain said other bearing therein.

13. Construction according to claim 1, wherein at least one of said support plates (15, 35) is a punched sheet metal element.

14. Construction according to claim 1, wherein at least one of said support plates (15, 35) has portions (42; 19) deformed from the major plane of the sheet metal which forms the support plate, and in which at least one of the deformations comprises a deep-drawn deformation.

15. Construction according to claim 1, wherein at least one of said support plates (15, 35) has portions (42; 19) deformed from the major plane of the sheet metal which forms the support plate, and in which at least one of the deformations comprises an extruded deformation.

16. Construction according to claim 1, wherein at least one of said support plates (15,35) has portions (42; 19) deformed from the major plane of the sheet metal which forms the support plate, and in which at least one of the deformations comprises an extrusion-molded deformation.

17. Construction according to claim 1, wherein said one support plate (15) secured to the frame (11) is formed with openings (45) in the projecting fins (39) for attachment to the frame (11).

18. Construction according to claim 1, wherein said one support plate (15) secured to the frame (11) is formed with projecting means (46) at the side thereof facing the frame;
said frame comprises a tubular shell (11);
and the projecting means (46) have radially outwardly directed surfaces (52) fitting against the inner surfaces (22) of said shell (11) to position and center the said one plate with respect to the shell.

19. Construction according to claim 18, wherein the projecting means (46) comprise inwardly extending punch deformations (47) formed from the other side of the respective support plate.

20. Construction according to claim 1, wherein said one support plate (15) having the other bearing (21) secured thereto is resilient in axial direction—with respect to the shaft (25)—and stiff in a direction transverse to said shaft to permit axial excursion of the shaft with respect to the housing upon differential heat expansion of the frame structure and the rotor.

21. Construction according to claim 1, further including an outer cover cap (16) protecting the rectifier.

22. Construction according to claim 21, further including a voltage regulator (34) secured to the alternator, said voltage regulator being positioned within the cover cap (16).

23. Construction according to claim 1, wherein the electrical insulating means (43, 43') comprises a spacer element;
further includes a projecting extension (44) to form a support element projecting axially from the spacer element;
and separate field excitation diodes (37), said field excitation diodes being secured to and supported by said projecting extensions, and electrically connectable to the rotor.

24. Construction according to claim 23, further including an insulated terminal element (DF) secured to the carrier portion of the spacer element for connection of a charge control lamp.

25. Construction according to claim 24, further including a pressure contact (D+) secured to the carrier portion of the spacer element and forming a resilient pressure connection for a voltage regulator.

26. Construction according to claim 1, wherein the support plates are of essentially similar plan outline.

27. Construction according to claim 10, wherein, before axial deformation of one of the support plates, said support plates are of essentially similar plan outline.

28. Construction according to claim 1, wherein the support plates have radial axes of symmetry which are essentially similar.

* * * * *